United States Patent [19]

Nishio et al.

[11] Patent Number: 5,985,677
[45] Date of Patent: Nov. 16, 1999

[54] METHOD OF REPAIRING SEMICONDUCTOR MEMORY, ELECTRON-BEAM MEMORY REPAIRING APPARATUS AND REDUNDANCY MEMORY CIRCUIT TO WHICH THE METHOD OF REPAIRING SEMICONDUCTOR MEMORY IS APPLICABLE

[75] Inventors: Naoki Nishio; Hideyuki Fukuhara; Yoichi Miyai; Yoshinobu Kagawa, all of Tokyo, Japan

[73] Assignees: Advantest Corporation; Texas Instruments Japan, both of Japan

[21] Appl. No.: 08/861,399

[22] Filed: May 21, 1997

[30] Foreign Application Priority Data

May 19, 1990 [JP] Japan ..................................... 2-125639
May 22, 1996 [JP] Japan ..................................... 8-127006

[51] Int. Cl.[6] .................................................. H01L 21/00
[52] U.S. Cl. .................................................. 438/4; 438/12
[58] Field of Search ................................... 365/200, 201; 438/4, 12; 371/10.2, 10.3

[56] References Cited

U.S. PATENT DOCUMENTS

| 4,748,597 | 5/1988 | Saito et al. | 365/200 |
| 5,698,984 | 12/1997 | Bryant et al. | 257/629 |
| 5,837,423 | 11/1998 | Okamoto | 430/296 |
| 5,840,627 | 11/1998 | Huggins | 438/669 |

*Primary Examiner*—Brian Dutton

[57] ABSTRACT

A semiconductor memory chip has fuses and a redundancy memory cell which can replace a normal memory cell that is found defective by cutting off the fuses. If the normal memory cell is defective, the fuses are cut off thereby to connect the redundancy memory cell instead of the normal memory cell which is defective. The entire surface of the semiconductor memory chip is coated with a resist layer. The coated the resist layer is exposed at regions of the fuses to an energy beam, and then developed form a resist pattern. The semiconductor memory chip is etched at the regions using the resist pattern as a mask for thereby cutting off the fuses. The fuses may be spaced at intervals of 2 μm or smaller, and can be cut off without causing damage to a layer beneath the fuses.

10 Claims, 6 Drawing Sheets

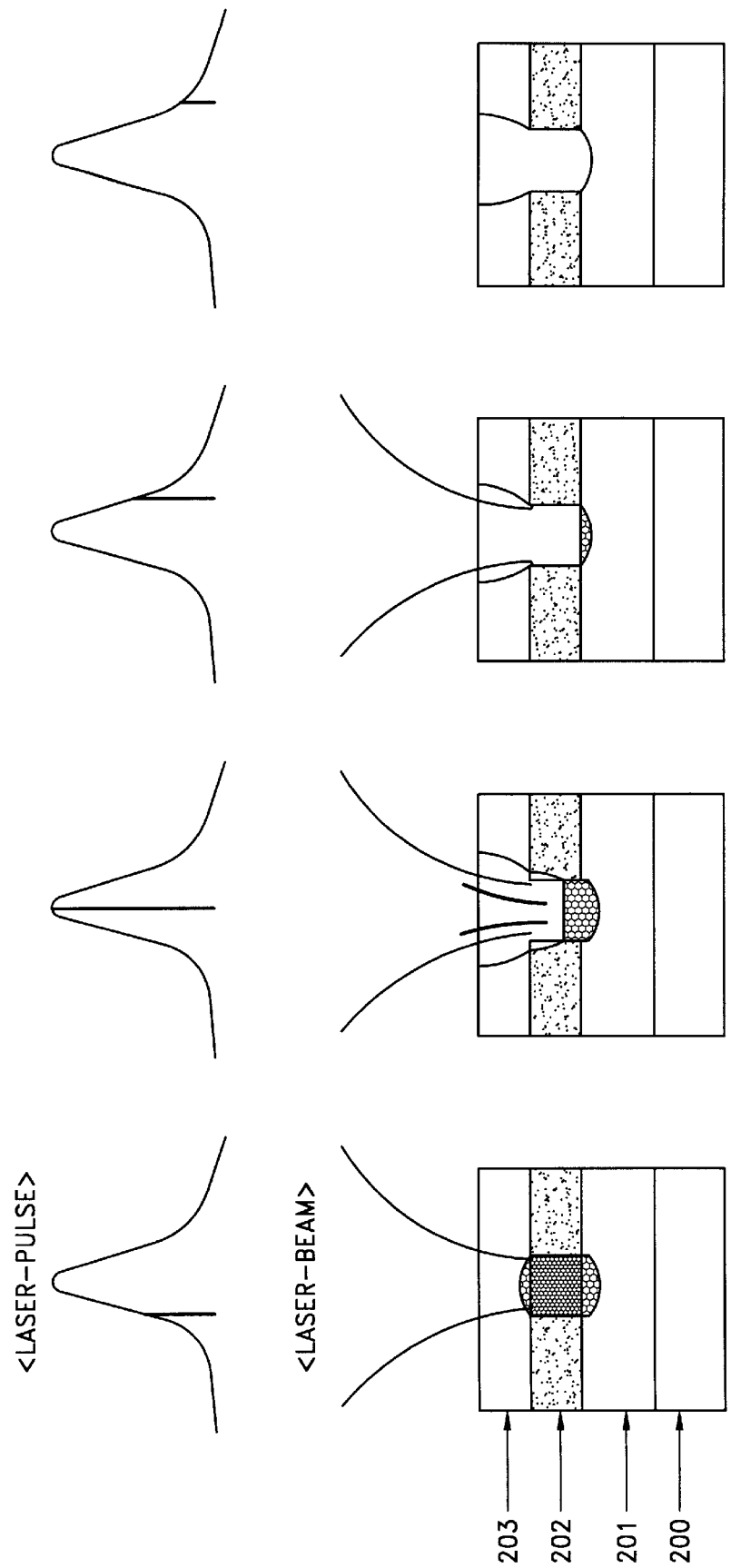

EB APPLIED

ETCHING

RESIST PATTERN
REMOVAL

EB APPLIED

CVD OR SPUTTERING
DEPOSITION

ETCHBACK

METHOD OF REPAIRING SEMICONDUCTOR MEMORY, ELECTRON-BEAM MEMORY REPAIRING APPARATUS AND REDUNDANCY MEMORY CIRCUIT TO WHICH THE METHOD OF REPAIRING SEMICONDUCTOR MEMORY IS APPLICABLE

BACKGROUND OF THE INVENTION

1. Field of the Invention

The present invention relates to a method of repairing a semiconductor memory by disconnecting a defective memory cell and connecting instead a redundancy memory cell in the semiconductor memory chip. The present invention is also concerned with an electron-beam memory repair apparatus and a redundancy memory circuit to which the method of repairing a semiconductor memory is applicable.

2. Description of the Prior Art

FIG. 1 of the accompanying drawings shows a semiconductor memory in a semiconductor memory chip on a semiconductor wafer, which includes a redundancy memory circuit comprising a redundancy cell. The semiconductor memory also includes normal memory cells 100 having 512 normal data lines with addresses 0~511, for example, and an address decoder 101 comprising logic gates 101a having respective output lines that are connected respectively to the 512 normal data lines through fuses 104a. Output addresses are selected by address lines $\overline{A_0}, A_0, \overline{A_1}, A_1, \ldots$. The address line $\overline{A_0}$ represents an inversion of the address line $A_0$.

The redundancy memory circuit includes a decoder 103 whose output is connected to a redundancy memory cell 102 through a redundancy data line. The address lines $\overline{A_0}, A_0, \overline{A_1}, A_1, \ldots$ are connected through respective fuses 104b to the inputs of the decoder 103. The redundancy memory circuit, which is made up of the redundancy memory cell 102, the redundancy data line, the decoder 103, and the fuses 104b, is normally in a disabled state. When an enable signal is applied, the disabled state of the redundancy memory circuit is canceled, and the output thereof is made effective.

The redundancy data line of the redundancy memory cell 102 in the redundancy memory circuit corresponds to the normal data lines of the normal memory cells 100. If the normal memory cell connected to the normal data line connected to the uppermost logic gate 101a, for example, is defective, then the fuse 104a connected to the output of the logic gate 101a is cut off, and fuses 104b connected to the input of the decoder 103 are cut off to use the redundancy data line connected to the redundancy memory cell 102 instead of the normal data line connected to the defective memory cell. In this manner, the normal data line connected to the defective memory cell is rendered ineffective, and the disabled state of the redundancy memory circuit is canceled by an enable signal, making effective the output of the redundancy memory cell 102 which is connected to the redundancy data line.

The fuses 104a, 104b are generally cut off by a laser-beam fuse cutting process. The principles of the laser-beam fuse cutting process will be described below with reference to FIGS. 2(a) through 2(d) of the accompanying drawings.

As shown in FIGS. 2(a) through 2(d), a semiconductor memory fuse region comprises an Si substrate 200, an insulating film 201 of $SiO_2$ disposed on the Si substrate 200, a fuse layer 202 disposed on the insulating film 201 as an interconnection layer of aluminum, polysilicon, or the like, and an insulating film 204 of $SiO_2$ disposed on the fuse layer.

When a laser pulse shown in upper areas of FIGS. 2(a) through 2(d) is applied to the semiconductor memory fuse region, the energy of the applied laser pulse is absorbed by the fuse layer 202, whose temperature increases, as shown in FIG. 2(a). When the temperature of the fuse layer 202 rises, the energy absorption rate of the fuse layer 202 increases, resulting in an intensive pressure buildup in the fuse layer 202. The intensive pressure buildup in the fuse layer 202 causes the upper insulating film 201 of $SiO_2$ to explode, allowing the fuse layer 202 to be vaporized, as shown in FIG. 2(b). When any remaining fuse layer is vaporized by the energy of a final portion of the laser pulse, the laser pulse reaches the lower insulating film of $SiO_2$ (see FIG. 2(c)), which is slightly vaporized (see FIG. 2(d)). The fuse is cut off in the manner described above.

The laser-beam fuse cutting process is usually carried out by a mechanism which positions a laser beam quickly and highly accurately to a given fuse position in a semiconductor memory chip and applies the laser beam to cut off the fuse in the fuse position. The mechanism cuts off the fuse based on repairable wafer chip information and defective data line address information which have been obtained from a preliminary test conducted prior to the repairing process.

Recent highly integrated semiconductor memory chips are reduced in size by positioning fuses according to design rules which are employed so as to minimize the area which is occupied in the memory chip area by the fuses. There are strong demands for lowering the cost of the semiconductor memory chips. However, the conventional laser-beam fuse cutting process suffers the following shortcomings:

(1) The laser-beam fuse cutting process is required to selectively blow off only desired fuses in a manner to minimize damage to surrounding and lower silicon substrate regions. To meet such a requirement, it is necessary to use a laser beam having a wavelength which is equal to or longer than the infrared wavelength range. Because of the wavelength limitation, the laser beam spot diameter cannot be smaller than about 2.5 $\mu m$.

(2) The positioning error of the mechanism for positioning a laser beam quickly and highly accurately to a given fuse position in a semiconductor memory chip is determined by the mechanical accuracy of the mechanism, and has a practical limit of about 0.3 $\mu m$.

In view of the above two drawbacks of the conventional laser-beam fuse cutting process, it has been technically difficult to reduce the interval between fuses in a semiconductor memory chip to a distance of 2 (m or smaller. Therefore, efforts to minimize the area occupied by fuses in semiconductor memory chips have been subject to limitations.

In recent semiconductor memories, fuses are formed in the same layer as metal interconnections such as of aluminum or the like for the following reasons:

Semiconductor memories have a plurality of interconnection layers with metal interconnections in the uppermost layer and polysilicon interconnections in the lowermost layer. If the lowermost interconnection layer is used as a fuse layer, then it is necessary to etch back insulating and interconnection layers above the fuse layer in the vicinity of fuse regions. Due to variations in the thicknesses of the insulating and interconnection layers and also variations in the etchback process, it has been difficult to leave an insulating layer of stable thickness on the fuse layer in the environment of multiple interconnection layers. Consequently, fuses are generally formed in the uppermost layer.

The metal of the uppermost layer has a very high reflectance with respect to an infrared laser beam. Light that has entered the uppermost layer is absorbed by the surface thereof owing to the skin effect, and cannot reach a lower portion of the uppermost layer. For this reason, the power of the laser beam needs to be increased in order to cut off fuses in the uppermost layer. With the increased laser beam power, the layer underneath the uppermost layer tends to be damaged when fuses are cut off. It has thus been highly difficult to cut off minute fuses stably with a laser beam.

SUMMARY OF THE INVENTION

It is therefore an object of the present invention to provide a method of repairing a semiconductor memory by cutting off fuses which may be spaced at intervals of 2 $\mu$m or smaller, without causing damage to a layer underneath the fuses.

Another object of the present invention is to provide an electron-beam memory repair apparatus and a redundancy memory circuit to which the above method of repairing a semiconductor memory is applicable.

According to a first aspect of the present invention, there is provided a method of repairing a semiconductor memory in a semiconductor memory chip by cutting off interconnections if a normal memory cell is defective, thereby to connect a redundancy memory cell in the semiconductor memory chip instead of the normal memory cell which is defective, comprising the steps of coating an entire surface of the semiconductor memory chip with a resist layer, exposing the resist layer at regions of the interconnections to an energy beam, developing the exposed resist layer to form a resist pattern, and etching the semiconductor memory chip at the regions using the resist pattern as a mask for thereby cutting off the interconnections.

According to a second aspect of the present invention, there is provided a method of repairing a semiconductor memory in a semiconductor memory chip by forming an interconnection if a normal memory cell is defective, thereby to connect a redundancy memory cell in the semiconductor memory chip instead of the normal memory cell which is defective, comprising the steps of coating an entire surface of the semiconductor memory chip with a resist layer, exposing the resist layer at a region where the interconnection is to be formed, to an energy beam, developing the exposed resist layer to form a resist pattern, etching the semiconductor memory chip at the region using the resist pattern as a mask, and depositing a deposition material in the region for thereby forming the interconnection.

According to a third aspect of the present invention, there is provided a method of repairing a semiconductor memory in a semiconductor memory chip by cutting off an interconnection and forming an interconnection if a normal memory cell is defective, thereby to connect a redundancy memory cell in the semiconductor memory chip instead of the normal memory cell which is defective, comprising the steps of coating an entire surface of the semiconductor memory chip with a resist layer, exposing the resist layer at a first region of the interconnection to an energy beam, developing the exposed resist layer to form a first resist pattern, etching the semiconductor memory chip at the first region using the first resist pattern as a mask for thereby cutting off the interconnection, exposing the resist layer at a second region where the interconnection is to be formed, to an energy beam, developing the exposed resist layer to form a second resist pattern, etching the semiconductor memory chip at the second region using the resist pattern as a mask, and depositing a deposition material in the second region for thereby forming the interconnection.

In each of the above methods, the energy beam may comprise an electron beam.

In the methods according to the second and third aspects, the redundancy memory cell may be connected by an interconnection branched from a data line connected to the normal memory cell, the interconnection having a cut-off region, and the step of exposing the resist layer may comprise the step of exposing resist layer at the cut-off region to the energy beam, and the step of depositing a deposition material may comprise the step of depositing the deposition material in the cut-off region for thereby connecting the interconnection.

In the methods according to the second and third aspects, the deposition material may comprise polysilicon or a metal material.

According to the present invention, there is also provided an electron-beam memory repair apparatus to which either one of the above methods is applicable, comprising a memory tester for detecting a defective memory cell in a semiconductor memory chip on a semiconductor wafer, a repair image pattern generator connected to the memory tester, for generating a repair image pattern based on information with respect to the defective memory cell detected by the memory tester and information with respect to fuses and a redundancy memory cell, a stage for supporting the semiconductor wafer which has been coated with a resist layer on an entire surface thereof and moving the semiconductor wafer two-dimensionally, an electron-beam exposure system for applying an electron beam to the semiconductor wafer supported on the stage, and a controller for controlling the stage and the electron-beam exposure system based on the repair image pattern generated by the repair image pattern generator thereby to form an exposure pattern corresponding to the repair image pattern on the resist layer.

According to the present invention, there is further provided a redundancy memory cell to which the method according to the second or third aspect is applicable, comprising a redundancy memory cell disposed in a semiconductor memory chip and connected to an interconnection branched from a data line of a normal memory cell, the interconnection having a cut-off region.

In the methods described above, the semiconductor memory chip is selectively etched using the resist pattern as a mask to cut off or form an interconnection. Since the redundancy memory cell is connected by cutting off the interconnection, it is not necessary to use fuses of a conventional shape suitable for being cut off by a laser beam. Because the interconnection is cut off or formed by etching or deposition, substantially no damage is caused to a layer beneath the interconnection layer which is cut off or formed.

The area occupied by a region (fuse region) where the interconnection is cut off or formed is determined by the diameter of the energy beam used and the accuracy with which the semiconductor memory chip is positioned with respect to the energy beam. For example, if the energy beam comprises an electron beam, then the resist layer can be exposed at a resolution of submicrons or smaller, and a positional detection accuracy of 0.05 $\mu$m or less can be achieved. Therefore, the area occupied by the region where the interconnection is cut off or formed is smaller than the area occupied by a fuse in the conventional process whose positional detection accuracy has suffered the practical limit of about 0.3 $\mu$m. According to the present invention, the interval (fuse interval) between regions where the interconnection is cut off or formed can be reduced to 0.2 $\mu$m.

In the redundancy memory circuit according to the present invention, the redundancy memory cell replaces the normal memory cell by connecting the cut-off region of the interconnection. The redundancy memory circuit does not need a decoder which has heretofore been required to replace the normal memory cell with the redundancy memory cell only by cutting off fuses.

With the methods according to the present invention, it is possible to cut off a fuse (interconnection) without damaging a layer underneath the fuse regardless of the material of the fuse (interconnection) to be cut off.

Inasmuch as it is not necessary to use fuses of a conventional shape suitable for being cut off by a laser beam, and the interval (fuse interval) between fuses can be reduced to 0.2 μm, the area occupied by fuses (interconnections) to be cut off is smaller than the area occupied by fuses in the conventional process.

The electron-beam memory repair apparatus according to the present invention offers the above advantages while carrying out the above methods.

The redundancy memory circuit according to the present invention is relatively simple in structure and can be manufactured inexpensively as it does not need a decoder which has heretofore been required to replace the normal memory cell with the redundancy memory cell only by cutting off fuses.

The above and other objects, features, and advantages of the present invention will become apparent from the following description with references to the accompanying drawings which illustrate an example of the present invention.

BRIEF DESCRIPTION OF THE DRAWINGS

FIGS. 2(a) through 2(d) are cross-sectional views illustrative of the principles of a laser-beam fuse cutting process;

DETAILED DESCRIPTION OF THE PREFERRED EMBODIMENTS

Figure 1:
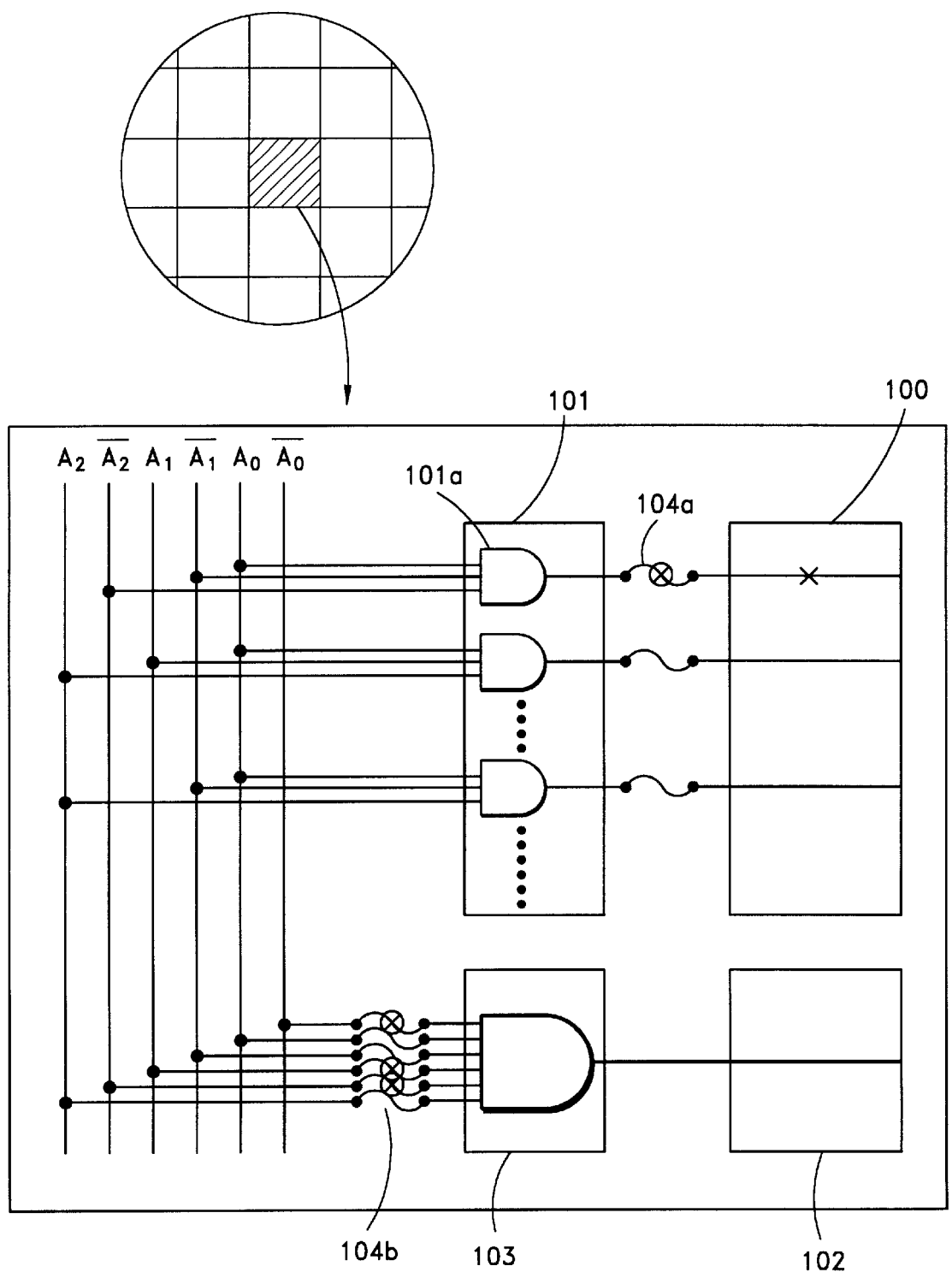
FIG. 1 is a circuit diagram, partly in block form, a general semiconductor memory in a semiconductor memory chip on a semiconductor wafer, which includes a redundancy memory circuit having redundancy memory cells.

1st Embodiment:

FIGS. 3(a) through 3(d) are illustrative of the principles of an electron-beam fuse cutting process in a method of repairing a semiconductor memory according to a first embodiment of the present invention.

As shown in FIGS. 3(a) through 3(d), a semiconductor memory fuse region comprises an Si substrate 1, an insulating film 2 of $SiO_2$ disposed on the Si substrate 1, a fuse layer 3 disposed on the insulating film 2 as an interconnection layer of aluminum, polysilicon, or the like, and an insulating film 4 of $SiO_2$ disposed on the fuse layer 3. The insulating film 4 of $SiO_2$ is coated with a resist layer 5 on the entire surface of the semiconductor memory chip, and then a given region of the resist layer 5, which corresponds to the fuse region, is exposed to an electron beam or a plurality of electron beams (see FIG. 3(a)), each having a beam spot of a rectangular, circular, or other shape. Then, the resist layer 5 is developed to remove its region corresponding to the fuse region, thereby forming a resist pattern 5' (see FIG. 3(b)). Using the resist pattern 5' as a mask, the insulating film 4 is etched. Then, using the resist pattern 5' and the etched insulating film 4 as a mask, the fuse layer 3 is etched (see FIG. 3(c)). Thereafter, the resist pattern 5' is removed (see FIG. 3(d)). The insulating film 4 and the fuse layer 3 may be etched in separate steps by respective different etching systems, or at respective etching rates controlled depending on etching times or under varying etching conditions by a single etching system.

In a method of repairing a semiconductor memory according to a first embodiment of the present invention, the electron-beam fuse cutting process as shown in FIGS. 3(a) through 3(d) is employed to cut off fuses thereby to connect a redundancy memory circuit in a semiconductor memory chip. For example, as shown in FIG. 1, if the normal memory cell connected to the normal data line connected to the uppermost logic gate 101a, for example, is defective, then the resist layer 5 is exposed to an electron beam at the region of the fuse 104a connected to the output of the logic gate 101 and the regions of those fuses 104b connected to the inputs of the decoder 103 which are connected to the address lines that are not shared by the input lines of the uppermost logic gate 101a. The resist layer 5 is then developed to form the resist pattern 5' which has rectangular or circular patterns corresponding to the exposed regions. Using the resist pattern 5' as a mask, the semiconductor memory chip is etched to cut off those fuses 104a, 104b in the exposed regions. The normal data line connected to the defective memory cell becomes ineffective, and the output of the redundancy memory cell 102 to the redundancy data line becomes effective.

Figure 3A:
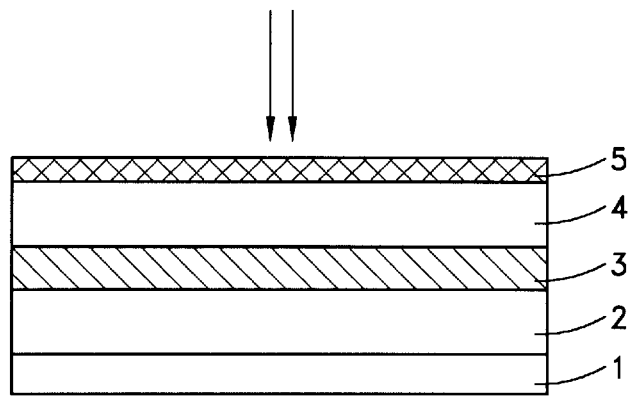
FIGS 3(a) through 3(d) are cross-sectional views illustrative of the principles of an electron-beam fuse cutting process in a method of repairing a semiconductor memory according to a first embodiment of the present invention.
Figure 3B:
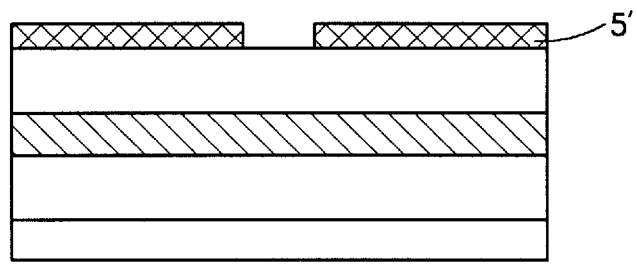
Figure 3C:
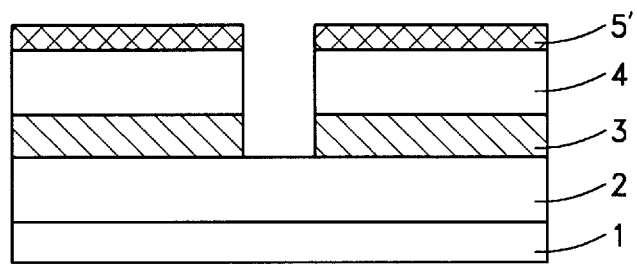
Figure 3D:
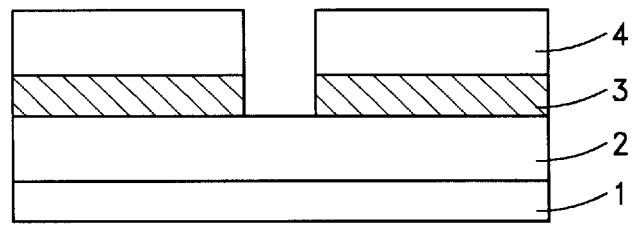
Figure 4:
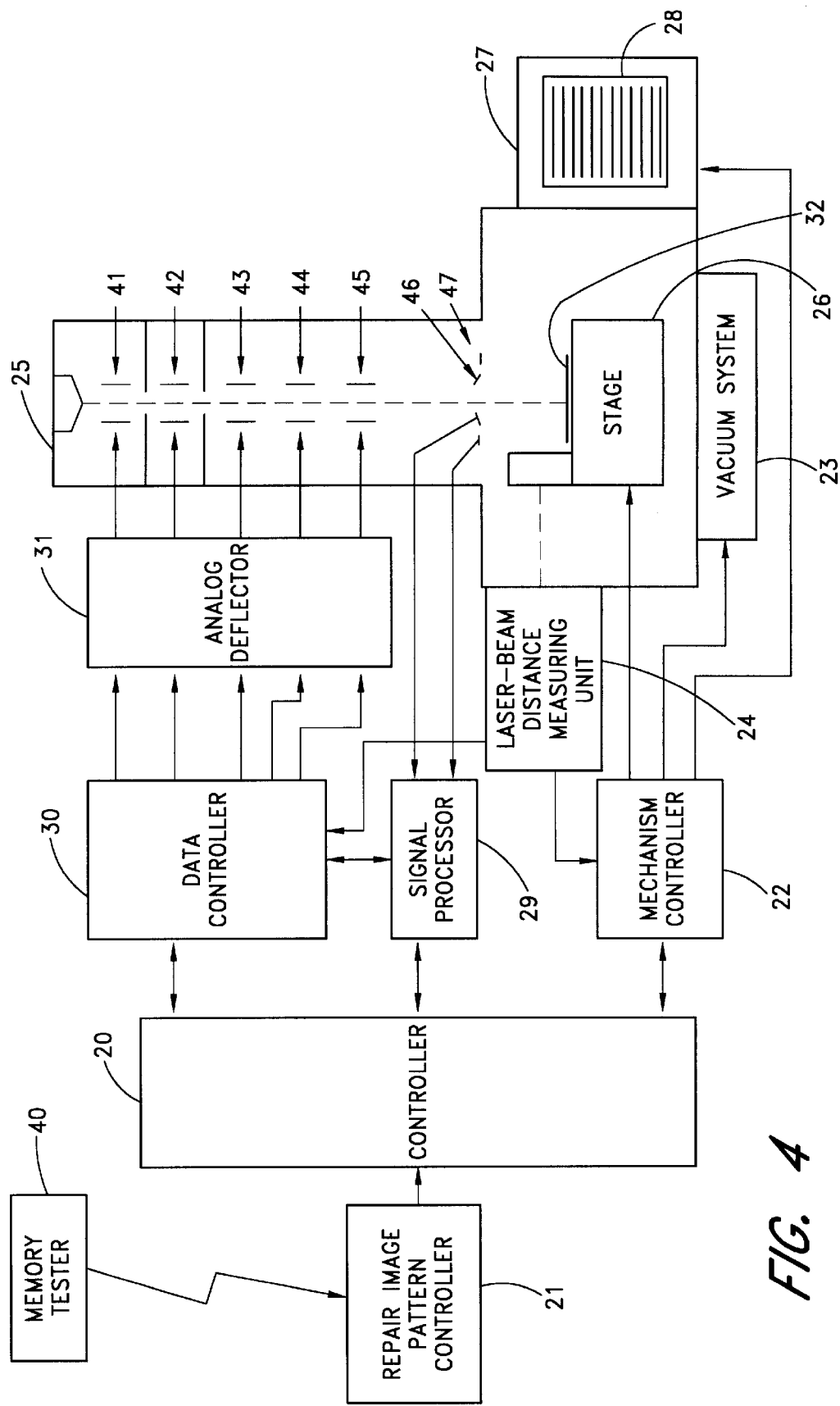
FIG. 4 is a block diagram of an electron-beam memory repair apparatus to which the method of repairing a semiconductor memory according to the first embodiment is applicable.

The electron-beam fuse cutting process shown in FIGS. 3(a) through 3(d) can be carried out by a known electron-beam exposure system. FIG. 4 shows in block form an electron-beam memory repair apparatus to which the method of repairing a semiconductor memory according to the first embodiment is applicable.

As shown in FIG. 4, semiconductor wafers 32 are housed in a cassette 28 in an automatic loader 27, and placed one by one on a two-dimensionally movable stage 26 in an electron-beam exposure optical system barrel 25 for exposure. The electron-beam optical system barrel 25 is combined with a vacuum system 23 which keeps a predetermined vacuum in the electron-beam optical system barrel 25. The vacuum system 23, the stage 26, and the automatic loader 27 are controlled by a mechanism controller 22.

The electron-beam optical system barrel 25 houses therein a blanker 41, a shaping deflector 42, an auxiliary deflector 43, a focus correcting lens 44, and a main deflector 45, which are controlled by an analog deflection unit 31 based on signals from a data controller 30. The electron-beam optical system barrel 25 also houses therein a reflected electron detector 46 and a Z-direction detector 47, which apply signals to a signal processor 29 for detecting a positional mark on the semiconductor wafer 32 placed on the stage 26 in order to position the semiconductor wafer 32 for exposure to an electron beam.

The stage 26 is combined with a laser-beam distance measuring unit 24 for detecting a distance by which the semiconductor wafer 32 placed on the stage 26 is two-dimensionally moved. The detected distance of two-dimensional movement of the semiconductor wafer 32 is read into a controller 20, which compares the detected distance with the position of a repair image pattern and supplies the result of comparison through the data controller 30 to the analog deflection unit 31.

A repair image pattern generator 21 determines which defective memory cell is to be rescued by a redundancy memory cell based on information of fuse coordinates relative to preliminary data lines (or word lines) and information (repair data) of defective memory cells from a memory tester 40, and generates a repair image pattern representative of a fuse region, i.e., an exposure region, where fuses are to be cut off thereby to connect the redundancy memory circuit for the memory cell rescue. The memory tester 40 is a known tester used in the wafer fabrication process.

Based on the repair image pattern generated by the repair image pattern generator 21, the controller 20 controls the mechanism controller 22, the signal processor 29, and the data controller 30.

In the electron-beam memory repair apparatus shown in FIG. 4, the resist layer 5 shown in FIG. 3(*a*) is exposed to an electron beam based on the repair image pattern, forming the resist pattern 5'. Based on the resist pattern 5', fuses are cut off thereby to connect the redundancy memory circuit.

The electron-beam memory repair apparatus can produce a pattern configuration at a resolution of submicrons or less, and has a positional detection accuracy of 0.05 μm or less. With the method of repairing a semiconductor memory being carried out by the electron-beam memory repair apparatus, it is possible to reduce the intervals between fuses in the semiconductor wafer chip shown in FIG. 1 to distances much smaller than 2 μm, for example. Therefore, the area occupied in the semiconductor wafer chip by the fuses can be reduced, and the cost of the semiconductor wafer chip can also be reduced.

In the above embodiment, the redundancy memory circuit is connected by cutting off fuses in the semiconductor wafer chip. However, the fuses may be dispensed with, and the redundancy memory circuit is connected by cutting off interconnections in the semiconductor wafer chip.

2nd Embodiment:

In the first embodiment, fuses are cut off to connect the redundancy memory circuit. However, fuses that are cut off may be disposed in a semiconductor wafer chip, and may be connected to connect the redundancy memory circuit.

FIGS. 5(*a*) through 5(*e*) illustrative of the principles of an electron-beam fuse connecting process in a method of repairing a semiconductor memory according to a second embodiment of the present invention.

As shown in FIGS. 5(*a*) through 5(*e*), a semiconductor memory fuse region comprises an Si substrate 11, an insulating film 12 of $SiO_2$, a fuse layer 13 having a cut-off region 16 having a predetermined width, and an insulating film 14' of $SiO_2$. The insulating film 14' of $SiO_2$ is coated with a resist layer 15 on the entire surface of the semiconductor memory chip, and then a given region of the resist layer 15, which corresponds to the cut-off region 16, is exposed to an electron beam. The electron beam should preferably be applied to an area wider than the cut-off region 16. Then, the resist layer 15 is developed to remove its region corresponding to the fuse region, thereby forming a resist pattern 15' (see FIG. 5(*b*)). Using the resist pattern 15' as a mask, the insulating film 14' is etched (see FIG. 5(*c*)). At this time, it is preferable to overetch the insulating film 14' down to the insulating film 12 for reliably making an electric connection in the cut-off region 16. Thereafter, the resist pattern 15' is removed, and polysilicon or a metal material such as aluminum or the like (which can freely be selected depending on the design) is deposited on the surface formed so far by sputtering or CVD (see FIG. 5(*d*)). Thereafter, the assembly is etched back until the insulating layer 14' appears except for the area where the polysilicon or the metal material is deposited in the cut-off region 16 (see FIG. 5(*e*)). In the above process, the insulating layer 14' is selectively removed using the resist pattern 15' as a mask, and the polysilicon or the metal material such as aluminum or the like is selectively deposited in the area from which the insulating layer 14' has been removed. The fuse layer 13 is now electrically connected across the cut-off region 16.

Figure 6:
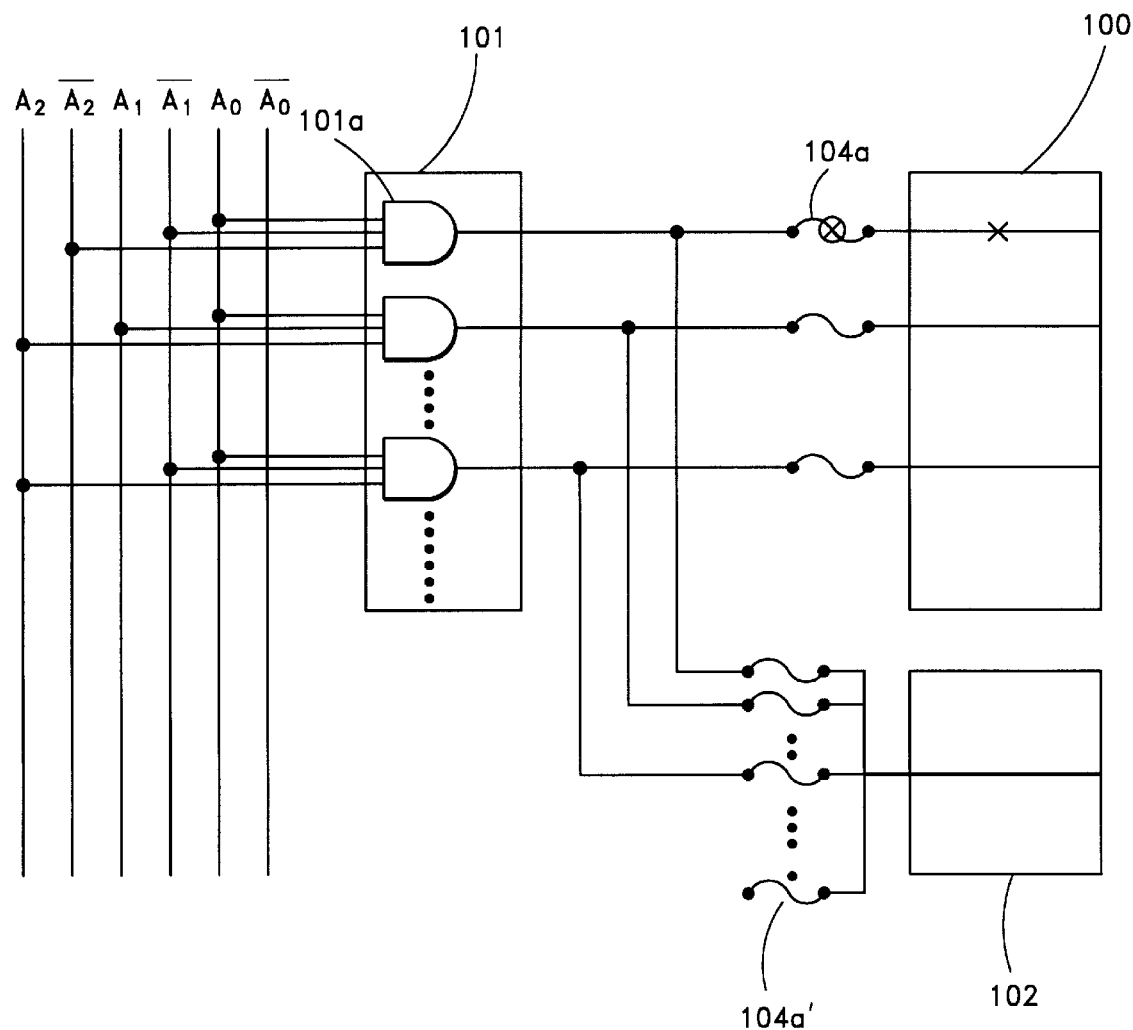
FIG. 6 is a block diagram of a redundancy memory circuit to which the method of repairing a semiconductor memory according to the second embodiment is applicable.

According to the second embodiment, the electron-beam fuse connecting process described above and the electron-beam fuse cutting process according to the first embodiment are combined with each other to connect a redundancy memory circuit shown in FIG. 6, for example.

FIG. 6 shows a semiconductor memory in a semiconductor memory chip on a semiconductor wafer. The semiconductor memory includes normal memory cells 100 and an address decoder 101 comprising logic gates 101*a* having respective output lines that are connected respectively to normal data lines through fuses 104*a*. The semiconductor memory also has a redundancy memory circuit which includes a redundancy memory cell 102 having a redundancy data line connected through fuses 104*a'* to output lines that are connected to the respective normal data lines coupled to the logic gates 101*a*. The fuses 104*a'* have cut-off regions, respectively, which each have such a width as to allow the resist layer 15 to be deposited on the insulating layer 14'.

If the normal memory cell connected to the normal data line connected to the uppermost logic gate 101*a*, for example, is defective, then the resist layer 5 is deposited on the semiconductor memory chip and exposed to an electron beam at the region of the fuse 104*a* connected to the output of the uppermost logic gate 101. The resist layer 5 is then developed to form the resist pattern 5' which has rectangular or circular patterns corresponding to the exposed regions. Using the resist pattern 5' as a mask, the semiconductor memory chip is etched to cut off the fuse 104*a* in the exposed region. The normal data line connected to the defective memory cell becomes ineffective. Thereafter, the resist pattern 5' is removed. The above process is the same as the electron-beam fuse cutting process shown in FIGS. 3(*a*) through 3(*d*).

Then, the resist layer 15 is deposited on the semiconductor memory chip and exposed to an electron beam at the region of the fuse 104*a'* which is connected to the output of the decoder 101*a* that is connected to the defective memory cell. The resist layer 15 is then developed to form the resist pattern 15' which has a rectangular or circular pattern corresponding to the exposed region. Using the resist pattern 15' as a mask, polysilicon or a metal material such as aluminum or the like is deposited on the surface formed so far by sputtering or CVD, thereby connecting the fuse 104*a'* at the exposed region. In this manner, the output of the redundancy memory cell 102 to the redundancy data line becomes effective. The fuse 104*a'* may be connected before the fuse 104*a* is cut off.

Figure 5A:
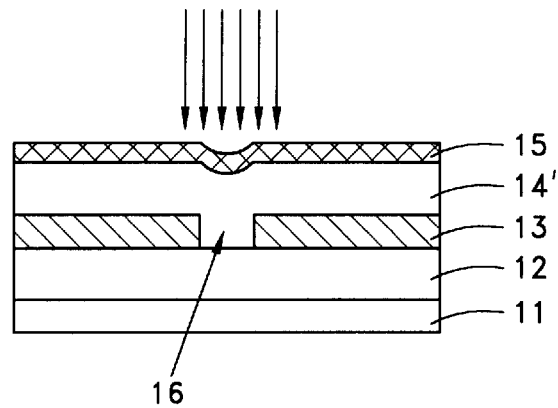
FIGS. 5(a) through 5(e) are cross-sectional views illustrative of the principles of an electron-beam fuse connecting process in a method of repairing a semiconductor memory according to a second embodiment of the present invention.
Figure 5B:
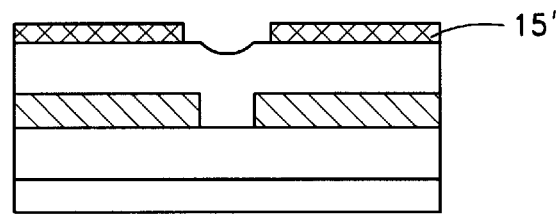
Figure 5C:
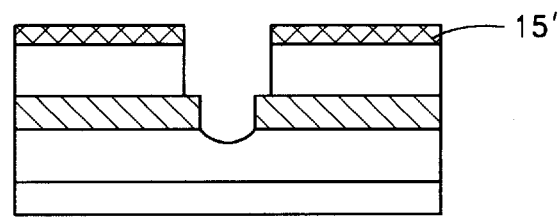
Figure 5D:
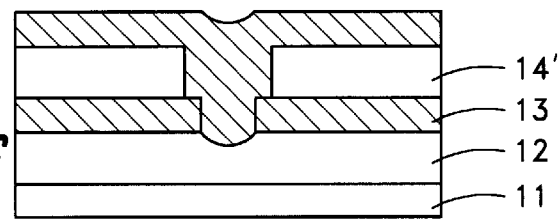
Figure 5E:
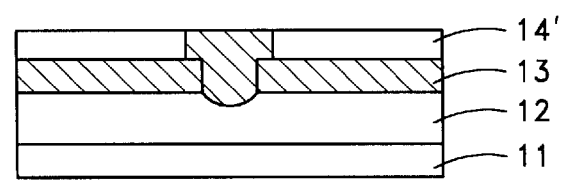

The electron-beam memory repair apparatus shown in FIG. 4 may be employed in the method of repairing a semiconductor memory according to the second embodiment of the present invention. Specifically, the repair image pattern generator 21 generates a repair image pattern for cutting off a fuse and a repair image pattern for connecting a fuse, and the step of exposing the resist layer 5 as shown in FIG. 3(a) and the step of exposing the resist layer 15 as shown in FIG. 5(a) are carried out based on those repair image patterns for thereby forming the resist patterns 5', 15'. Using the resist patterns 5', 15' as masks, the fuses are cut off and connected for thereby connecting the redundancy memory circuit.

The method of repairing a semiconductor memory according to the second embodiment is applicable to the redundancy memory circuit as shown in FIG. 6. Since the redundancy memory circuit as shown in FIG. 6 does not need the decoder 103 shown in FIG. 1 for redundancy memory circuit switching, the cost of the semiconductor memory chip may be lower than the cost of the semiconductor memory chip according to the first embodiment.

In the second embodiment, the connection of a fuse and the cutting-off of a fuse are combined with each other for connecting the redundancy memory circuit, the redundancy memory circuit may be connected only by connecting a fuse. In such a modification, however, the semiconductor memory is arranged to make the defective memory cell ineffective by connecting the fuse.

In the second embodiment, the redundancy memory circuit is connected by connecting a fuse which has been cut off in the semiconductor memory chip. However, interconnections with cut-off regions be used instead of fuses with cut-off regions. Moreover, the redundancy data line connected to the redundancy memory cell 102 shown in FIG. 6 may be dispensed with, and, when a defective memory cell is found, a redundancy data line may be connected to the redundancy memory cell 102 according to the process shown in FIGS. 5(a) through 5(e).

In each of the first and second embodiments, the resist layer is exposed to the electron beam. However, an ion beam, a short-wavelength far-ultraviolet laser beam for exposure, etc. may be used in the method of repairing a semiconductor memory.

Devices to which the method of repairing a semiconductor memory according to the present invention is applicable are not limited to independent semiconductor memory devices as shown. However, the method of repairing a semiconductor memory according to the present invention is also applicable to memory devices incorporated in logic devices.

The method of repairing a semiconductor memory according to the present invention is also applicable to various redundancy circuits other than the redundancy circuits shown in FIGS. 1 and 6.

While a preferred embodiment of the present invention has been described using specific terms, such description is for illustrative purposes only, and it is to be understood that changes and variations may be made without departing from the spirit or scope of the following claims.

What is claimed is:

1. A method of repairing a semiconductor memory in a semiconductor memory chip by cutting off interconnections if a normal memory cell is defective, thereby to connect a redundancy memory cell in the semiconductor memory chip instead of the normal memory cell which is defective, comprising the steps of:

coating an entire surface of said semiconductor memory chip with a resist layer;

exposing the resist layer at regions of the interconnections to an energy beam;

developing the exposed resist layer to form a resist pattern; and etching said semiconductor memory chip at said regions using said resist pattern as a mask for thereby cutting off the interconnections.

2. A method of repairing a semiconductor memory in a semiconductor memory chip by forming an interconnection if a normal memory cell is defective, thereby to connect a redundancy memory cell in the semiconductor memory chip instead of the normal memory cell which is defective, comprising the steps of:

coating an entire surface of said semiconductor memory chip with a resist layer;

exposing the resist layer at a region where the interconnection is to be formed, to an energy beam;

developing the exposed resist layer to form a resist pattern;

etching said semiconductor memory chip at said region using said resist pattern as a mask; and depositing a deposition material in said region for thereby forming the interconnection.

3. A method of repairing a semiconductor memory in a semiconductor memory chip by cutting off an interconnection and forming an interconnection if a normal memory cell is defective, thereby to connect a redundancy memory cell in the semiconductor memory chip instead of the normal memory cell which is defective, comprising the steps of:

coating an entire surface of said semiconductor memory chip with a resist layer;

exposing the resist layer at a first region of the interconnection to an energy beam;

developing the exposed resist layer to form a first resist pattern;

etching said semiconductor memory chip at said first region using said first resist pattern as a mask for thereby cutting off the interconnection;

exposing the resist layer at a second region where the interconnection is to be formed, to an energy beam;

developing the exposed resist layer to form a second resist pattern;

etching said semiconductor memory chip at said second region using said resist pattern as a mask; and depositing a deposition material in said second region for thereby forming the interconnection.

4. A method according to claim 1, wherein said energy beam comprises an electron beam.

5. A method according to claim 2, wherein said energy beam comprises an electron beam.

6. A method according to claim 3, wherein said energy beam comprises an electron beam.

7. A method according to claim 2, wherein said redundancy memory cell is connected by an interconnection branched from a data line connected to the normal memory cell, said interconnection having a cut-off region, and wherein said step of exposing said resist layer comprises the step of exposing resist layer at said cut-off region to said energy beam, and said step of depositing a deposition material comprises the step of depositing the deposition material in said cut-off region for thereby connecting the interconnection.

8. A method according to claim 3, wherein said redundancy memory cell is connected by an interconnection branched from a data line connected to the normal memory cell, said interconnection having a cut-off region, and wherein said step of exposing said resist layer at said second region comprises the step of exposing resist layer at said cut-off region to said energy beam, and said step of depositing a deposition material comprises the step of depositing the deposition material in said cut-off region for thereby connecting the interconnection.

9. A method according to claim 2, wherein said deposition material comprises polysilicon or a metal material.

10. A method according to claim 3, wherein said deposition material comprises polysilicon or a metal material.

* * * * *

UNITED STATES PATENT AND TRADEMARK OFFICE
CERTIFICATE OF CORRECTION

PATENT NO. : 5,985,677
DATED : November 16, 1999
INVENTOR(S) : Nishio, et. al.

It is certified that error appears in the above-identified patent and that said Letters Patent is hereby corrected as shown below:

Title page, item [73] after "Texas Instruments Japan" insert --Ltd.--

Title page, item [30] delete --May 19, 1990 [JP] .......2-125639--

Signed and Sealed this

Twelfth Day of September, 2000

Attest:

Q. TODD DICKINSON

Attesting Officer

Director of Patents and Trademarks